United States Patent [19]

Aoyama et al.

[11] Patent Number: 5,218,461
[45] Date of Patent: Jun. 8, 1993

[54] SCANNING OPTICAL APPARATUS

[75] Inventors: Masaaki Aoyama; Akira Morimoto, both of Tokyo, Japan

[73] Assignee: Asahi Kogaku Kogyo Kabushiki Kaisha, Tokyo, Japan

[21] Appl. No.: 582,155

[22] Filed: Sep. 14, 1990

[30] Foreign Application Priority Data

Sep. 14, 1989 [JP] Japan .................................. 1-239149
Sep. 14, 1989 [JP] Japan .................................. 1-239150

[51] Int. Cl.$^5$ .............................................. H04N 1/04
[52] U.S. Cl. ............................ 358/471; 358/474; 358/480; 358/481
[58] Field of Search ............... 358/474, 478, 481, 484, 358/486, 400, 401, 480, 482, 483, 484, 487, 489, 493, 494, 496, 497, 471; 250/200, 216; 359/196, 197, 198, 210, 227

[56] References Cited

U.S. PATENT DOCUMENTS 4,896,222  1/1990  Fukai .................................. 358/446
4,961,079  10/1990 Owens .................................. 358/75

Primary Examiner—Edward L. Coles, Sr.
Assistant Examiner—Jerome Grant, II
Attorney, Agent, or Firm—Sandler Greenblum & Bernstein

[57] ABSTRACT

A scanning optical apparatus has a laser beam source for emitting a laser beam, a scanning deflector for deflecting and scanning the laser beam in a principal scanning plane, a scanning lens for imaging the deflected laser beam on a scanning surface to form a spot thereon, an imaging lens for forming the laser beam from the laser beam source into a line spread function image in an auxiliary scanning plane that is perpendicular to the principal scanning plane before the laser beam is made incident to the scanning deflector, a static deflector which is located on the line spread function image and which is adapted to guide the beam from the light source to the scanning deflector and guide the reflected beam from the scanning deflector to the scanning lens, and a holding member for holding at least the laser beam source, the imaging lens and the static deflector separately from other optical elements.

15 Claims, 4 Drawing Sheets 5,218,461

SCANNING OPTICAL APPARATUS

BACKGROUND OF THE INVENTION

1. Field of the Invention

This invention relates to a scanning optical apparatus for forming a pattern onto a scanning surface, and particularly to an apparatus where a high resolution pattern is required, such as a laser make-up device (i.e., a plate making device).

2. Description of the Prior Art

In order to draw a high accuracy pattern, it is necessary that a laser beam is focused into a spot as small as possible. In order to make the spot small, an F number of the optical system is required to be small. As a result, a focal depth becomes shallow. Therefore, a curvature of field must be reduced so that the predetermined spot diameter can be maintained in every point of the scanning surface.

However, in the case of general scanning optical systems such as a laser beam printer, since the laser beam makes incident to the polygon mirror from out of the optical axis of the scanning lens, a deflecting point on the reflecting surface of the polygon mirror changes asymmetrically about the optical axis. Therefore, there is a problem that the curvature of field becomes asymmetric on the scanning surface and correction can not be made when a symmetric lens is used about the optical axis.

In order to reduce the curvature of field, it is effective to make the change of the deflecting point symmetric with respect to the optical axis.

To solve the above problem, a laser beam can be made incident to a polygon mirror through the optical axis of the $f\theta$ lens. According to this construction, since the appearance of the curvature of field is made symmetric, correction can be made using a symmetric lens with respect to the optical axis and the value becomes very small.

However, in order to employ such a construction, it is necessary that a static deflector for separating a beam directed to the polygon mirror from a beam incoming to an $f\theta$ lens is disposed in the optical path.

Japanese Patent Early Laid-open Publication No. Sho 60-233616 discloses a construction in which a light beam from a light source is made incident to a polygon mirror through the optical axis of a scanning lens using a polarizing beam splitter and a ¼ wave plate.

It is noted that in the construction of Japanese Patent Early Laid-open Publication No. Sho 60-233616, a laser beam is temporarily imaged on a reflecting surface of the polygon mirror in an auxiliary scanning plane in order to correct adverse effects caused by a tilting error of the reflecting surface of the polygon mirror with respect to a rotational axis thereof.

However, according to the construction of the above-mentioned Publication, because the angle of incidence of the light beam to a polarized beam splitter is changed in accordance with the rotation of the polygon mirror, the transmittance of the polarized beam splitter is gradually changed as it goes toward the peripheral portion from the central portion and irregularity of light quantity occurs on the scanning surface.

SUMMARY OF THE INVENTION

The present invention has been accomplished in view of the above problems. It is therefore an object of the present invention to provide a scanning optical apparatus that is capable of preventing an asymmetric curvature of field on a scanning surface with a comparatively simple construction and performing a drawing with high accuracy, in which an irregularity in light quantity is less on the scanning surface.

BRIEF DESCRIPTION OF THE DRAWINGS

FIG. 1–4 show a scanning optical apparatus explaining one embodiment of the present invention, in which FIG. 1 is a side view of a light source unit viewing from I—I line in FIG. 2, FIG. 2 is a plan view of the scanning optical apparatus;

FIG. 3 is a side view of the apparatus of FIG. 1 viewing from III—III line in FIG. 2, and FIG. 4 is a perspective view explaining an arrangement of optical elements of the apparatus of FIG. 1.

DETAILED DESCRIPTION OF THE EMBODIMENTS

Figure 1:
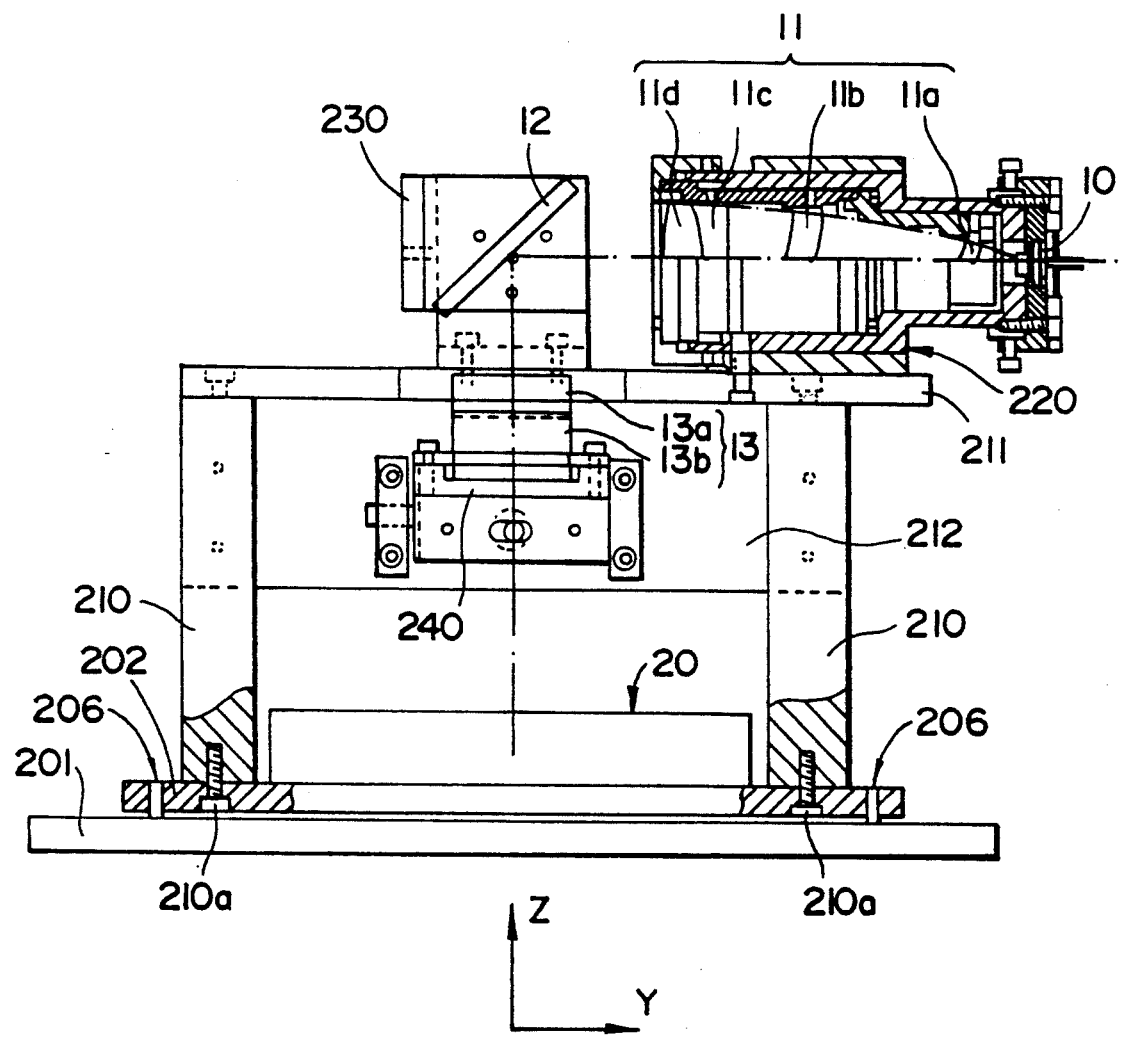

The present invention will now be described with reference to the drawings. FIGS. 1 through 4 show one embodiment of a scanning optical apparatus according to the present invention.

First of all, the arrangement of the optical elements of this apparatus will be described with reference to FIG. 4.

The illustrated optical system includes a laser diode 10 as a light source, a collimator lens 11 for converting a divergent light emitted from the laser diode 10 into a parallel beam, a mirror 12 for reflecting a collimated beam, a cylindrical lens 13 as an imaging lens for forming a line spread function image from this beam, a prism block 20 having a slit mirror 21 as a static deflector disposed in such a manner as to be coincident with the line spread function image position of the beam, a polygon mirror 30 as a scanning deflector for deflecting a beam reflected by the slit mirror 21, and an $f\theta$ lens 40 as a scanning lens for converging the reflected beam by the polygon mirror 30 to form a spot on the scanning surface.

A surface on which the beam is scanned by the polygon mirror 30 is hereby referred to as a "principal scanning plane" and a surface vertical to the principal scanning plane and including an optical axis of the $f\theta$ lens 40 is hereby referred to as an "auxiliary scanning plane".

The prism block 20 is of a rectangular parallelepipedal configuration formed of a triangular prism 22 and a trapezoidal prism 23 cemented together, the cementing surface thereof having the slit mirror, 21 as a total reflection mirror made by using vacuum evaporation technology. An angle of the slit mirror 21 relative to the principal scanning plane is approximately 45°.

The divergent light emitted from the laser diode 10 is collimated by the collimator lens 11 and the collimated laser beam is converged onto the slit mirror 21 by the cylindrical lens 13 and then reflected in its totality by the slit mirror 21 to proceed to the polygon mirror 30 passing through the optical axis of the $f\theta$ lens 40.

Figure 3:
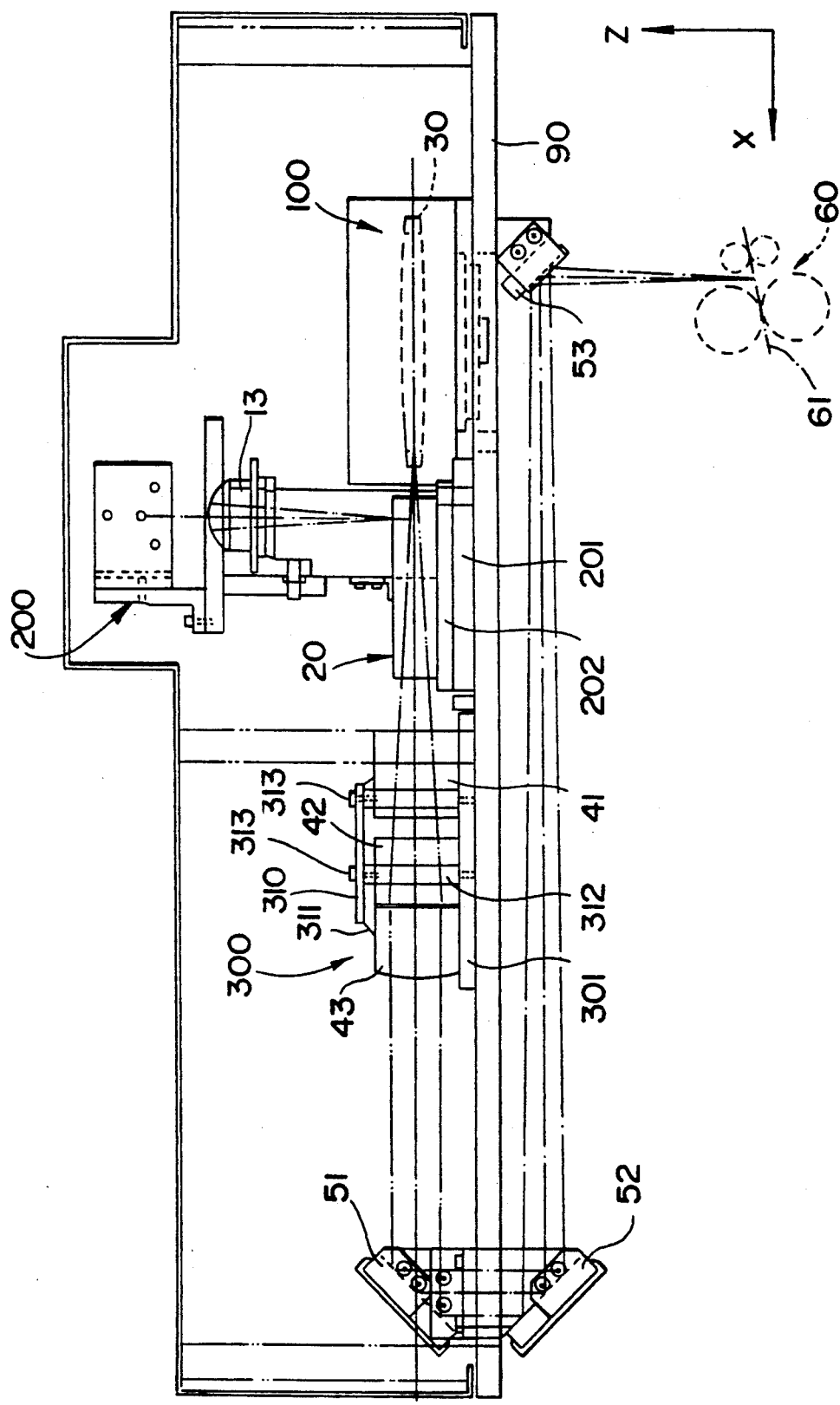

The beam reflected and deflected by the polygon mirror 30 reaches the prism block 20 again with a predetermined spread. Most of the beam is transmitted through a circumambient portion of the slit mirror 21 and made incident to the $f\theta$ lens 40. As shown in FIG. 3, the beam going out from the $f\theta$ lens 40 is deflected downward towards a base 90 by a mirror 51 that is disposed on the left-hand side of the base 90, and then introduced to mirrors 52, 53 to form a spot scanned at a fixed speed on a panel 61 as a scanning surface transferred by a feed roller 60.

As the slit mirror 21 has no change of transmittance caused by a change in the angle of rotation of the polygon mirror 30, there is no change in light quantity due to image height on the scanning surface. If the polarizing beam splitter is used instead of the prism block 20, the light quantity on the scanning surface changes due to image height.

In this specification the term "image height" means the distance from the optical axis.

In order to obtain a light quantity on the scanning surface, it is preferably that an eclipse of the beam proceeding towards the scanning lens from the polygon mirror is lessened. For this purpose, it is preferable that the slit area of a slit mirror is made as narrow as possible.

A concrete assembling construction of respective optioal elements will now be described with reference to FIGS. 1 through 3.

At the same time, adjusting the direction of each optical element will be described with reference to FIG. 4.

Figure 4:
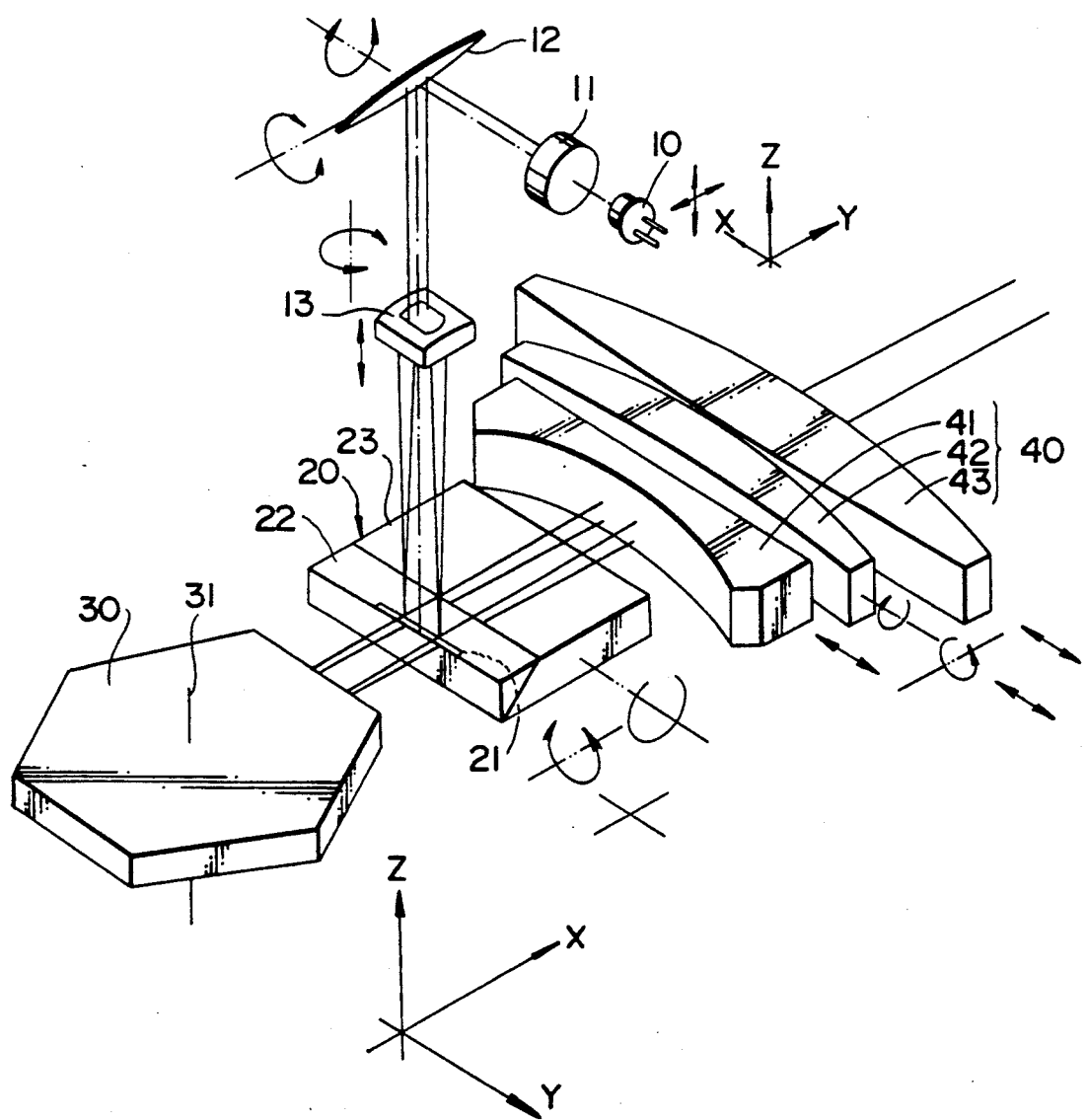

The coordinates of FIG. 4 are established with reference to the progressing direction of the beam, the emitting direction of the beam from the laser diode 10 and the direction of the optical axis of the fθ lens 40 are defined as the x-axis, the direction of the rotational axis 31 of the polygon mirror 30 is defined as the z-axis, and the direction vertical to the x- and z-axes is defined as y-axis.

The respective optical elements are unitized as several units and each unit is mounted on the base plate 90 respectively.

A polygon unit 100 in which the polygon mirror 30 and a motor for driving thereof are built is immovably fixed to the base 90.

A light source unit 200, provided with the laser diode 10, the collimator lens 11, the mirror 12, the cylindrical lens 13, and the prism block 20, includes a lower substrate 201, which is slidable in the x-axis direction relative to the base 90, and an upper substrate 202, which is adjustable in its pivotal movement on the x- and y-axes relative to the lower substrate 201.

Figure 2:
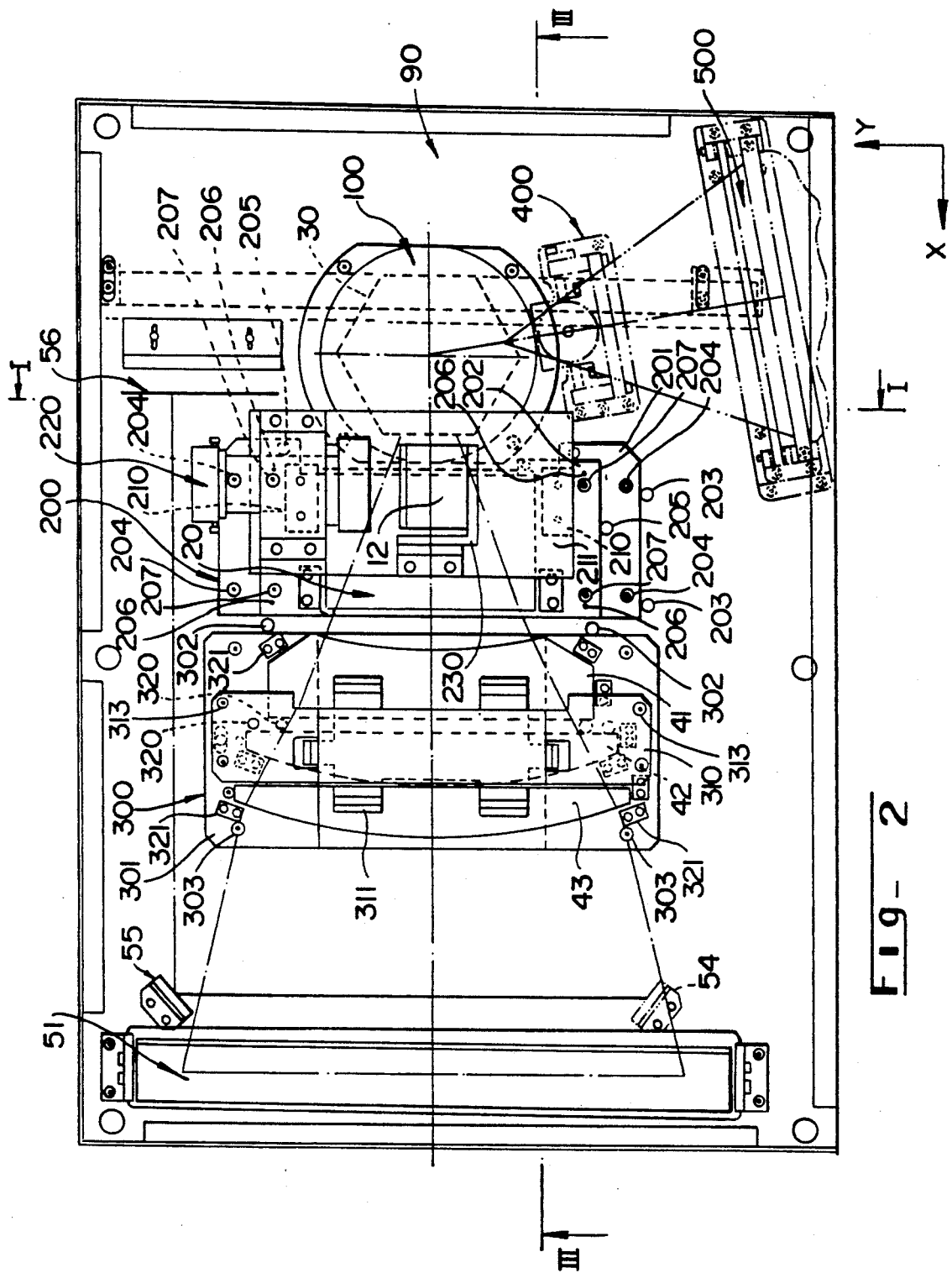

The lower substrate 201, as shown in FIG. 2, is positioned in the y-axis direction by two abutment pins 203 fixed to the base 90, and is fixed to the base 90 by four fixing bolts 204 at four corners thereof. The fixing bolts 204 are threadedly engaged with the base 90 through the lower substrate 201. Since the through-holes of the lower substrate 201 for allowing the bolts 204 to penetrate therethrough are formed larger than the diameter of each bolt, by loosening these fixing bolts 204, the lower substrate 201 can slide in the x-axis direction along the abutment pin 203.

The slide adjustment of the light source unit 200 in the x-axis direction functions to focus the laser beam on the scanning surface in the auxiliary scanning direction when the laser beam does not focus on the scanning surface due to errors in curvature of lens, spacing between the lens surfaces, etc.

The upper substrate 202 is positioned in the X-axis and y-axis directions by abutment pins 205 fixed to three places of the lower substrate 201. Also, the upper substrate 202 is fixed to the lower substrate 201 by fixing bolts 207 in four corners of the upper substrate 202. The tips of the adjusting bolts 206 which are disposed adjacent to the fixing bolts 207 are abutted with the lower substrate 201, as shown in FIG. 1. As a result, by manipulating the adjusting bolts 206 by loosening the fixing bolts 207, the upper substrate 202 can be pivoted on the x- and y-axes relative to the lower substrate 201.

The adjustment of the light source unit 200 including the prism block about the X-axis is performed for correcting deformation of the spot shape on the scanning surface and the deterioration of quality of the image, and is used in order to enhance the efficiency of the entire system after adjustment of the prism block 20 in the x-and y-axis direction has been completed.

The prism block 20 fixed to the center of the upper substrate can slide in the y-axis direction relative to the upper substrate 202. If eclipse of the beam by the prism block 20 is taken into consideration, it is desirable that the dimensions of the slit mirror 21 be as small as possible. Slide adjustment of the prism block 20 in the y-axis direction is required in order to align the slit mirror 21 with the line spread function image formed by the cylindrical lens 13. In particular an adjustment is required when the size of the slit mirror is formed about the same as that of the line spread function image.

Two leg portions 210, which are threadedly engaged with the upper substrate 202, both sides of the prism block 20, and the leg portions, are fixed by fixing screws 210a, as shown in FIG. 1. A horizontal plate 211 is bridged between upper ends of the leg portions 210, and a vertical plate 212 is bridged between the leg portions 210 under the horizontal plate 211.

A cylindrical lens-barrel 220, in which the laser diode 10 and the collimator lens 11 formed of first to fourth lenses 11a to 11d are built, and a mirror supporting portion 230 for supporting the mirror 12, are fixed onto the horizontal plate 211.

As the laser diode 10 has an irregularity in the light emitting position for each product, it is designed such as to be slidably adjustable in the y- and z-directions so that the beam can be aligned with a designed optical axis.

The collimator lens 11 can slide in the y-axis direction in order to adjust a correlation with respect to the laser diode 10. This adjustment is performed for focusing the laser beam on the scanning surface in the principal scanning direction when the laser beam does not focus on the scanning surface due to errors in the curvature of the lens system, spacing between the lens surfaces, etc.

The mirror 12 can be adjusted about the x-axis and y-axis directions.

Also, the vertical plate 212 has a cylindrical lens 13 composed of a combination of a positive lens 13a and a negative lens 13b mounted thereon via a holder 240.

Since there is a possibility for the cylindrical lens 13 to include irregularities for each product caused by finishing errors, it is designed such that slide adjustments in the optical axis (x-axis) direction, as well as pivotal adjustments about the optical axis, are possible. The former adjustment is performed in order to properly focus on the slit mirror by adjusting the movement of the line spread function image along the optical axis direction, and the latter adjustment is performed in order to align the forming direction of the line spread function image with the direction of the slit mirror 21.

Component parts from the laser diode 10 to the prism block 20 are integrally formed as one unit independent from other parts. In this manner, assembling accuracy can be enhanced and displacement between the position for forming the line spread function image and the slit mirror 21 can be prevented.

A lens unit 300 has an fθ lens 40 composed of three anamorphic lenses 41, 42 and 43, and a lens substrate 301 on which these lenses are arranged. The lens substrate 301 is abutted with abutment pins 302 fixed to two places of the base θ0, thereby to be positioned in the x-axis direction, and fixed to the base 90 by fixing bolts 303 at four corners thereof.

Accordingly, by loosening the fixing bolts 303, the lens substrate 301 can slide in the y-axis direction with an abutment pin 302 serving as a guide.

Also, the three anamorphic lenses 41, 42 and 43 are fixed in the z-axis direction relative to the lens substrate 301 by a pressing spring board 311 which is pressured by a presser plate 310 covering the central lens 42, and the central lens is pivotally adjustably mounted on the x- and y-axes.

Adjustment of the fθ lens 40 is performed in order to correct the tilt of an image caused by errors of displacement, and deterioration of image quality.

Supporting poles 312, which are slightly longer than the height of the lens, as shown in FIG. 3, are secured to the lens substrate 301 at portions corresponding to four corners of the presser plate 310 by screw means, and the presser plate 310 is fixed to the supporting poles 312 by fixing bolts 313.

Also, respective lenses are positioned by abutment pins 320, 320, etc., and L-shaped fixing plates 321, 321, etc., which are fixed to the lens substrate 301 by two bolts respectively. As a result, the lenses are fixed in the x- and y-directions relative to the lens substrate 301.

A position for the abutment pin 203 for positioning the light source unit 200 and a position for the abutment pin 302 for positioning the lens unit 300 are determined with reference to the center of rotation of the polygon mirror 30.

A monitor system for detecting a rotating position of the polygon mirror 30 is mounted on the base 90, as shown in FIG. 2. The monitor system consists of a monitor light source unit 400 for emitting a monitor beam, and a monitor beam receiving unit 500 for receiving a monitor beam reflected by the polygon mirror 30. The monitor system uses a different reflecting surface of the polygon mirror 30 from the surface reflecting the laser light from the laser diode 10.

The monitor light source emits a laser beam at the rotational axis of the polygon mirror 30, and reflected light by the polygon mirror scans on a transmission scale (not shown) of the monitor beam receiving unit 500. The monitor beam receiving unit 500 has a light condensing portion for condensing the light transmitted to the scale, and a light receiving element for receiving the condensed light and outputting a signal indicating the rotation of the polygon mirror.

What is claimed is:

1. A scanning optical apparatus, comprising:
a laser beam source for emitting a laser beam;
a scanning deflector for deflecting said laser beam and scanning said laser beam in a principal scanning plane;
a scanning lens for imaging said deflected laser beam on a scanning surface to form a spot thereon;
an imaging lens for forming said laser beam from said laser beam source into a line spread function image in an auxiliary scanning plane that is perpendicular to said principal scanning plane at a location before the location that said laser beam is made incident to said scanning deflector;
a static deflector located on said line spread function image, adapted to guide said laser beam from said light source to said scanning deflector and guide said reflected beam from said scanning deflector to said scanning lens; and
means for integrally holding at least said laser beam source, said imaging lens and said static deflector as a unit separate from other optical elements.

2. A scanning optical system according to claim 1, wherein said other optical elements includes said scanning lens.

3. A scanning optical system according to claim 1, wherein said laser beam made incident to said scanning deflector from said static deflector is made incident thereto along the optical axis of said scanning lens.

4. A scanning optical system according to claim 1, wherein said static deflector is disposed in such a manner to be coincident with an imaging portion of said laser beam by said imaging lens, said static deflector having a slit mirror disposed along a direction where said laser beam is scanned and adapted to reflect a laser beam from said laser beam source towards said scanning deflector.

5. A scanning optical system according to claim 4, wherein said laser beam made incident to said scanning deflector from said static deflector is made incident thereto along the optical axis of said scanning lens.

6. A scanning optical system according to claim 1, wherein said imaging lens comprises a cylindrical lens.

7. A scanning optical system according to claim 6, wherein said laser beam made incident to said scanning deflector from said static deflector is made incident thereto along the optical axis of said scanning lens.

8. A scanning optical system according to claim 1, wherein said scanning deflector comprises a polygon mirror.

9. A scanning optical system according to claim 8, wherein said laser beam made incident to said scanning deflector from said static deflector is made incident thereto along the optical axis of said scanning lens.

10. A scanning optical apparatus according to claim 1, further comprising means for adjusting the position of said holding means.

11. A scanning optical apparatus according to claim 10, wherein said adjusting means comprises a pivot mechanism for pivoting said holding means about a pivot axis that is generally vertical to an optical axis of said scanning lens in said auxiliary scanning plane.

12. A scanning optical apparatus according to claim 10, wherein said adjusting means comprises a slide mechanism for sliding said holding means in a direction of the optical axis of said scanning lens.

13. A scanning optical apparatus according to claim 10, wherein said adjusting means comprises a slide mechanism for sliding said holding means in a direction that is generally perpendicular to the optical axis of said scanning lens in a principal scanning plane.

14. A scanning optical apparatus according to claim 10, wherein said adjusting means comprises a pivot mechanism for pivoting said holding means about a pivot axis that is parallel with the optical axis of said scanning lens.

15. A scanning optical apparatus according to claim 10, wherein said adjusting means comprises a pivot mechanism for pivoting said holding means about a pivot axis that is generally vertical to the optical axis of said scanning lens in said principal scanning plane.

* * * * *